(12) United States Patent
Samavedam et al.

(10) Patent No.: US 6,514,808 B1
(45) Date of Patent: Feb. 4, 2003

(54) TRANSISTOR HAVING A HIGH K DIELECTRIC AND SHORT GATE LENGTH AND METHOD THEREFOR

(75) Inventors: Srikanth B. Samavedam, Austin, TX (US); Christopher C. Hobbs, Austin, TX (US); William J. Taylor, Jr., Round Rock, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/997,358

(22) Filed: Nov. 30, 2001

(51) Int. Cl.[7] .................. H01L 21/336; H01L 21/8234; H01L 21/8222; H01L 21/76; H01L 21/30
(52) U.S. Cl. .................. 438/197; 438/287; 438/299; 438/301; 438/424; 438/439
(58) Field of Search .................. 438/197, 287, 438/299, 301, 421, 424, 426, 439

(56) References Cited

U.S. PATENT DOCUMENTS

| | | | |
|---|---|---|---|
| 5,372,675 A | * 12/1994 | Wakabayashi et al. | ...... 156/649 |
| 5,679,968 A | * 10/1997 | Smayling et al. | ........... 257/213 |
| 5,773,348 A | 6/1998 | Wu | |
| 5,989,967 A | 11/1999 | Gardner et al. | |
| 5,994,747 A | * 11/1999 | Wu | ............ 257/408 |
| 6,011,290 A | 1/2000 | Gardner et al. | |
| 6,104,077 A | * 8/2000 | Gardner et al. | ............. 257/336 |
| 6,127,251 A | * 10/2000 | Gardener et al. | ........... 257/410 |
| 6,136,653 A | 10/2000 | Sung et al. | |
| 6,136,657 A | * 10/2000 | Yang et al. | ................. 438/303 |
| 6,153,477 A | 11/2000 | Gardner et al. | |
| 6,190,996 B1 | * 2/2001 | Mouli et al. | ................. 257/522 |
| 6,255,165 B1 | * 7/2001 | Thuragate et al. | .......... 438/257 |
| 6,297,107 B1 | * 10/2001 | Paton et al. | ................. 438/291 |
| 6,348,390 B1 | * 2/2002 | Wu | ............................ 438/305 |
| 6,352,885 B1 | * 3/2002 | Wieczorek et al. | ......... 438/197 |
| 6,423,629 B1 | * 7/2002 | Ahn et al. | .................. 438/619 |

FOREIGN PATENT DOCUMENTS

EP      0276695      8/1988
JP      11-191622   * 7/1999

* cited by examiner

Primary Examiner—Jerome Jackson
Assistant Examiner—Shrinivas H Rao
(74) Attorney, Agent, or Firm—Daniel D. Hill; James L. Clingan, Jr.

(57) ABSTRACT

A transistor device (19) utilizes a high K dielectric (24) between a gate electrode (16) and a substrate (12). The high K dielectric (24) is etched under the gate electrode (16) so that there is an area between the gate electrode (16) and the substrate (12) that is void of high K dielectric (24). The source/drains extensions (28 and 30) are minimized to extend substantially in alignment with the edge of gate dielectric (24) to reduce overlap with the gate dielectric (24). This results in reduced capacitance between the gate and the source/drain extensions. The void areas (20 and 22) between the gate and the substrate (12) may remain void or may be filled with a low K dielectric, or at least a dielectric that is not high K.

11 Claims, 3 Drawing Sheets

TRANSISTOR HAVING A HIGH K DIELECTRIC AND SHORT GATE LENGTH AND METHOD THEREFOR

CROSS REFERENCE TO RELATED APPLICATION

A related application entitled "Selective Metal Oxide Removal", by Hobbs et al., and having application Ser. No. 09/916,023 was filed on Jul. 26, 2001, and assigned to the assignee hereof.

FIELD OF THE INVENTION

This invention relates to integrated circuits, and more particularly, to integrated circuits with transistors having high K dielectrics and short gate lengths.

RELATED ART

As dimensions of integrated circuit transistors continue to shrink, gate dielectrics of the transistors have become thinner and shorter as well. The thinner gate dielectrics are generally made from materials known as high K dielectrics because they are made from materials having dielectric constants greater than that of silicon oxide. These high K materials increase the capacitive coupling between the gate of the transistor and the channel. This increased coupling has become necessary because the background well doping in which a transistor is formed has increased. The increase in well doping is due to the need to avoid punch-through between the source and the drain of the transistor. Increased doping of the well caused it to be more difficult to invert the channel between the source and drain. Thus, the result was the need for increased coupling between the gate and the channel in order to achieve the needed inversion.

The gate electrode is not only coupled capacitively to the channel region but also to the source/drain extension regions of the transistor. A high gate-to-channel coupling is desirable, but a high gate-to-extension coupling is not desirable. The thin gate dielectric and its high K characteristic thus result in undesired increased capacitance between the gate and the source/drain extensions. This capacitance is commonly known as Miller capacitance. Miller capacitance has the adverse effect of making the transistor operate more slowly when it is switching. For example, in a digital circuit application, it may be important for the transistor to turn on and off very quickly, so having a transistor with low Miller capacitance is very important.

To reduce Miller capacitance in a transistor having a high K dielectric and short gate length, it may be possible to reduce the overlap between the source/drain extensions and the gate. One technique to do this has been to provide a film around the gate prior to a source-drain implant step. This film acts as spacer to offset the source/drain extension implant from the gate so that with subsequent processing the diffusion of the implant would not extend as far under the gate as had been typical. This additional film also complicates the processing.

Another technique to reduce overlap is to reduce the amount of lateral diffusion of the implant. Lateral diffusion is reduced by decreasing the anneal time and/or temperature. However, decreased anneal time and/or temperature may cause reduced dopant activation. Thus, there is a need for short gate length transistors with reduced Miller capacitance for high speed switching applications.

BRIEF DESCRIPTION OF THE DRAWINGS

Shown in FIG. 1 is a cross-section of a transistor device at a first stage in processing which is known in the art.

The drawings are intended to help show an embodiment of invention and are not to scale.

DESCRIPTION OF THE INVENTION

A transistor having reduced Miller capacitance is achieved by undercutting the high K dielectric material that lies between the gate electrode and the substrate. A lateral dimension of the high K dielectric material is shorter than a corresponding lateral dimension of the gate electrode. Substantially all of the area of overlap between the gate electrode and the source/drain regions does not have high K material therebetween. The void that is left as a result of the undercut can either be left as a void in subsequent processing steps, or the void can be filled with an insulating material having a dielectric constant lower than the gate dielectric. This is better understood by reference to the following description and the drawings.

Figure 1:
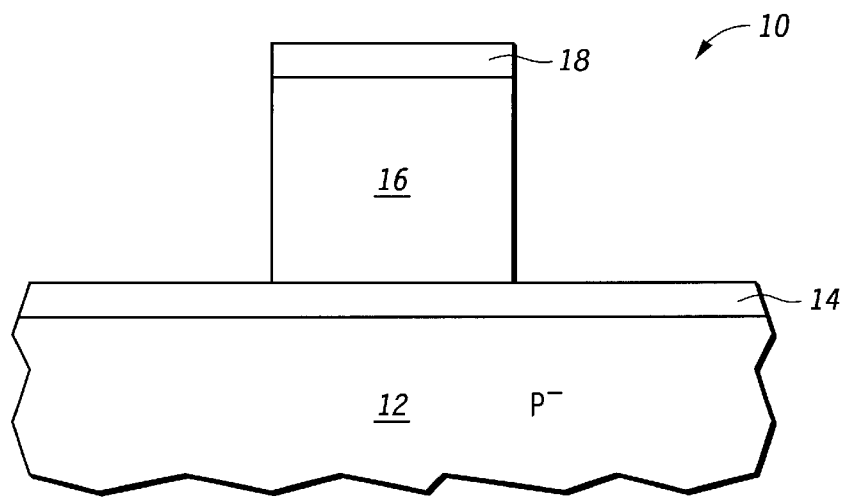

Shown in FIG. 1 is a prior art device 10 having a substrate 12, a high K dielectric 14, a gate electrode 16, and an anti-reflective coating (ARC) 18. This is a conventional structure at an early point in processing to form a (metal oxide semiconductor) MOS transistor. The gate electrode 16 is commonly formed from polysilicon and has a lateral dimension, measured in the gate length direction, of between 10 and 100 nanometers. ARC layer 18 is commonly formed from a silicon-rich nitride. High K dielectric 14 is preferably hafnium oxide. Substrate 12 is preferably silicon and may be overlying an insulator as is typical for (silicon-on-insulator) SOI substrates. Substrate 12 in FIG. 1 is doped to be a P minus (P−) conductivity type. Other semiconductor materials than silicon could be used as well for substrate 12. High K dielectric 14 may be other high K materials such as aluminum oxide, hafnium silicate, zirconium silicate, hafnium aluminate, lanthanum aluminate, zirconium aluminate, and lanthanum oxide. Multiple layers of these and other high K materials could also be used to form the high K dielectric 14 in other embodiments. High K dielectrics are considered to be dielectric materials that have a dielectric constant greater than silicon oxide which has a dielectric constant of 3.9. Note that gate electrode 16 could be formed from other materials than polysilicon. For example, metals are sometimes used for many gate electrode applications. Such metals include titanium nitride, tantalum nitride, and tantalum silicon nitride. Other materials may be used as well. Additionally, other materials than silicon nitride may be used for ARC layer 18. As illustrated in FIG. 1, gate electrode 16 of prior art device 10 has been etched to its gate configuration and the high K dielectric 14 is under gate electrode 16 and over substrate 12. Note that is some embodiments, an interfacial layer (not shown) may first be formed on substrate 12 and the high-K dielectric layer formed on the interfacial layer.

Figure 2:
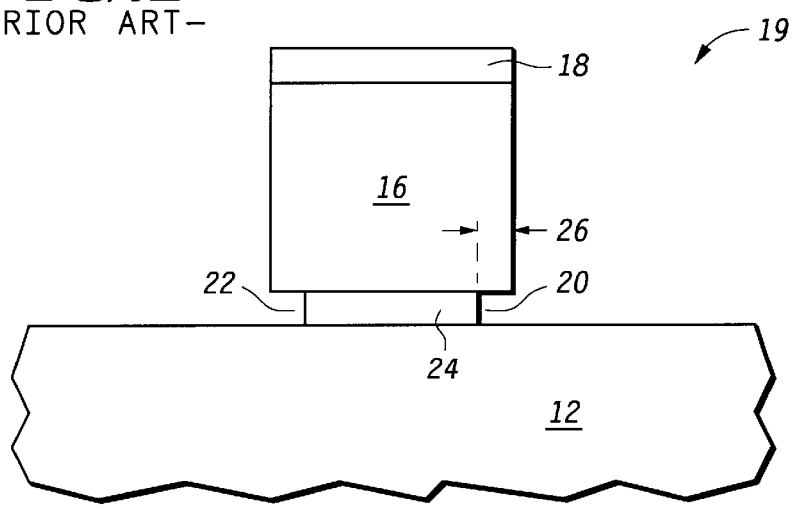
FIGS. 2–7 are cross sections of the transistor device of FIG. 1 at subsequent and sequential process steps according to a preferred embodiment of the invention.

FIGS. 2–7 illustrate a cross sectional view of a device 19 at various processing steps according to one embodiment of the invention. FIG. 2 illustrates a device 19 after a high K dielectric 24 has been etched to provide an area 20 and an area 22 under gate electrode 16 which is void of dielectric material. This leaves a high K dielectric material 24 under gate 16 with areas 20 and 22 adjacent thereto. Voids of areas 20 and 22 are achieved in a furnace or a rapid thermal processing chamber with an HCl ambient at a temperature between 500 degrees C. and 800 degrees C. (Celsius). Other halide-containing chemistries may be used as well. The formation of voids 20 and 22 is a timed etch, so that the distance from the edge of gate electrode 16 and the edge of high K dielectric 24 is a predetermined amount. This distance is shown as distance 26 in FIG. 2. Thus, the lateral dimension of high K dielectric 24 is shorter than that of gate electrode 16. The undercut of gate electrode 16 can be controlled as needed. The temperature selection is such a control. A lower temperature provides a lower etch rate and thus increased control of the depth of the voids. Thus, a particular parameter, such as temperature, can be chosen to result in the etch rate which provides sufficient control to repeatably provide the desired amount of undercut. In the illustrated embodiment, the device 19 is annealed at a temperature of between 800 and 500 degrees Celsius in a halide-containing chemistry for between 10 and 500 seconds. The halide-containing chemistry preferably comprises HCl or $Cl_2$. Using this process, a lateral edge of the gate dielectric is undercut between about 10 angstroms to 500 angstroms from an edge of the gate electrode.

Figure 3:
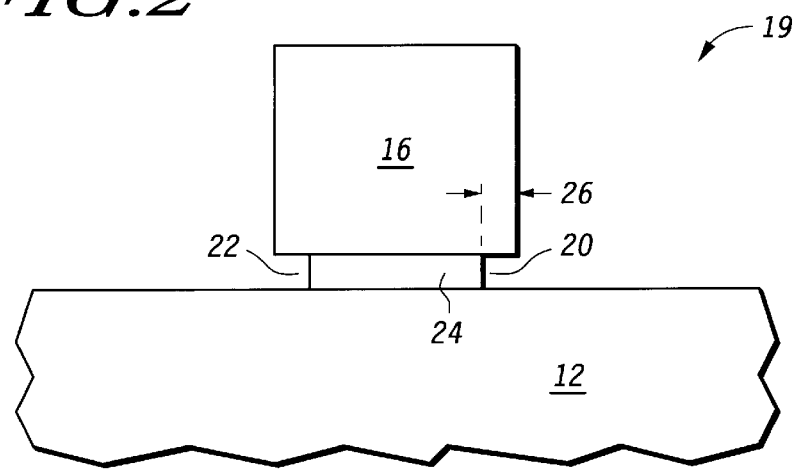
Figure 4:
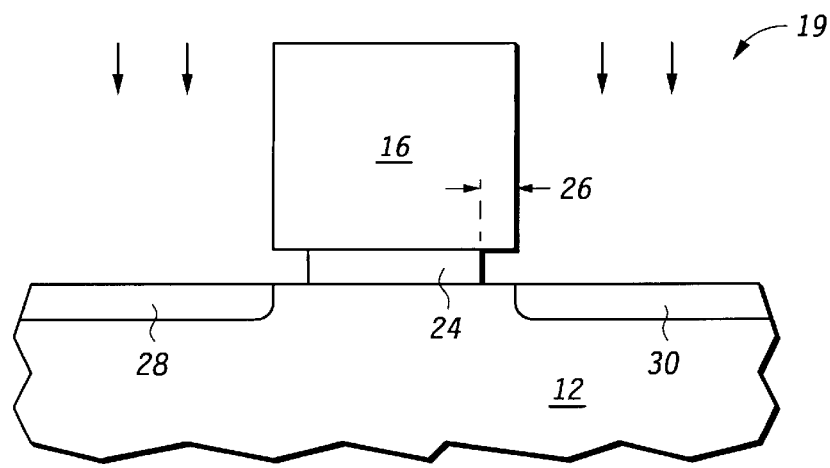

FIG. 3 illustrates device 19 after ARC 18 has been removed. Note that in other embodiments, it is possible to remove ARC 18 prior to the step of undercutting. FIG. 4 illustrates device 19 after an implant step (the vertical arrows show the device being subjected to ion implantation) is used to form source/drain extensions 28 and 30. Source/drain extensions 28 and 30 in FIG. 4 line up with the edges of gate electrode 16. Gate electrode 16 acts as a mask for the implant step. This implant could be angled, if desired, so that source/drain extensions 28 and 30 would not line up perfectly with the gate electrode 16 but would be a fixed and predetermined distance inward from the outer dimensions of gate electrode 16. Thus, the result of the angled implant would have source drain extensions 28 and 30 extending partially under gate electrode 16.

Figure 5:
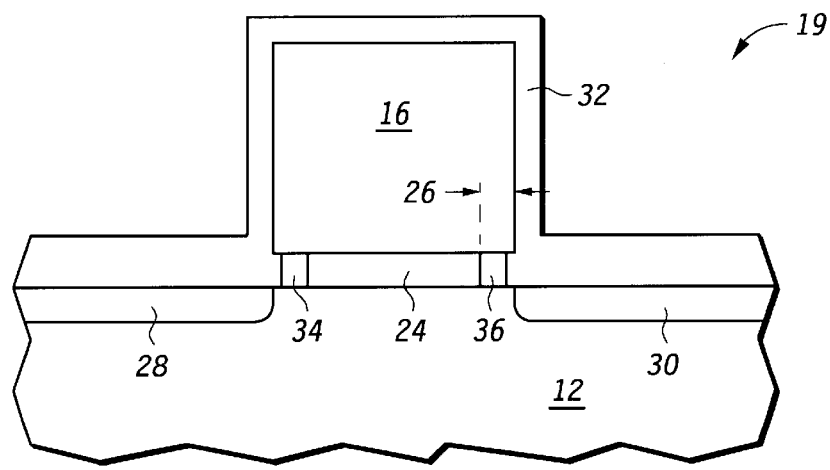

FIG. 5 illustrates device 19 after a liner layer 32 has been deposited over gate electrode 16 and over source/drain extensions 28 and 30. The liner layer 32 is formed from an insulating material such as silicon oxide. This deposition is preferably CVD (chemical vapor deposition) oxide. Other deposition processes may be used as well, such as plasma enhanced CVD oxide. The liner 32 further defines and limits areas 22 and 20 so that there is a void 34 in previous area 22 and a void 36 in previous area 20 (see FIG. 3). The dimensions of void 34 are defined by liner 32 and high K dielectric 24. As shown in FIG. 5, voids 34 and 36 would have extremely low dielectric constants because they are voids. In the alternative, voids 34 and 36 could be filled wit a non-high K material which would have been deposited prior to the deposition of liner 32.

Figure 6:
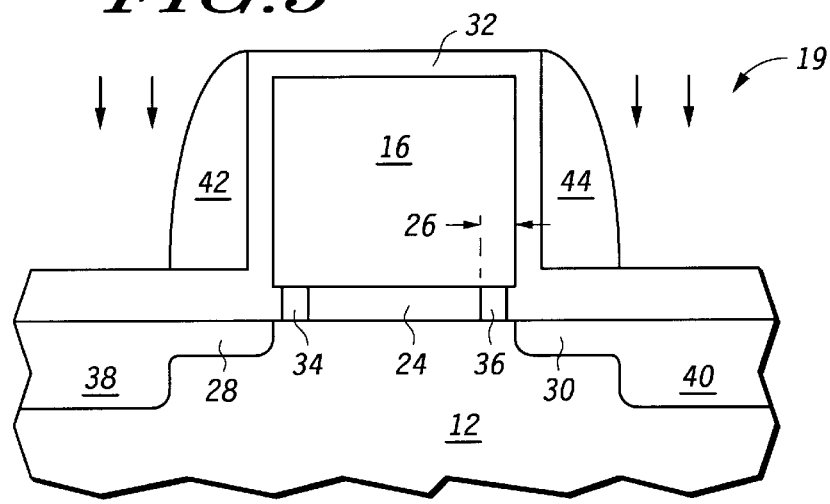

FIG. 6 illustrates device 19 after formation of sidewall spacers 42 and 44 adjacent to gate electrode 16 with liner 32 lying between the sidewall spacers and gate electrode 16. Also shown in FIG. 6 is heavily doped source and drains 38 and 40 after an implant step using sidewall spacers 42 and 44 as masks. Heavily doped regions 38 and 40 align with the sides of sidewall spacers 42 and 44 and are deeper than the source/drain extensions 28 and 30. The vertical arrows indicate the device receiving ion implantation for the formation of heavily doped regions 38 and 40.

Figure 7:
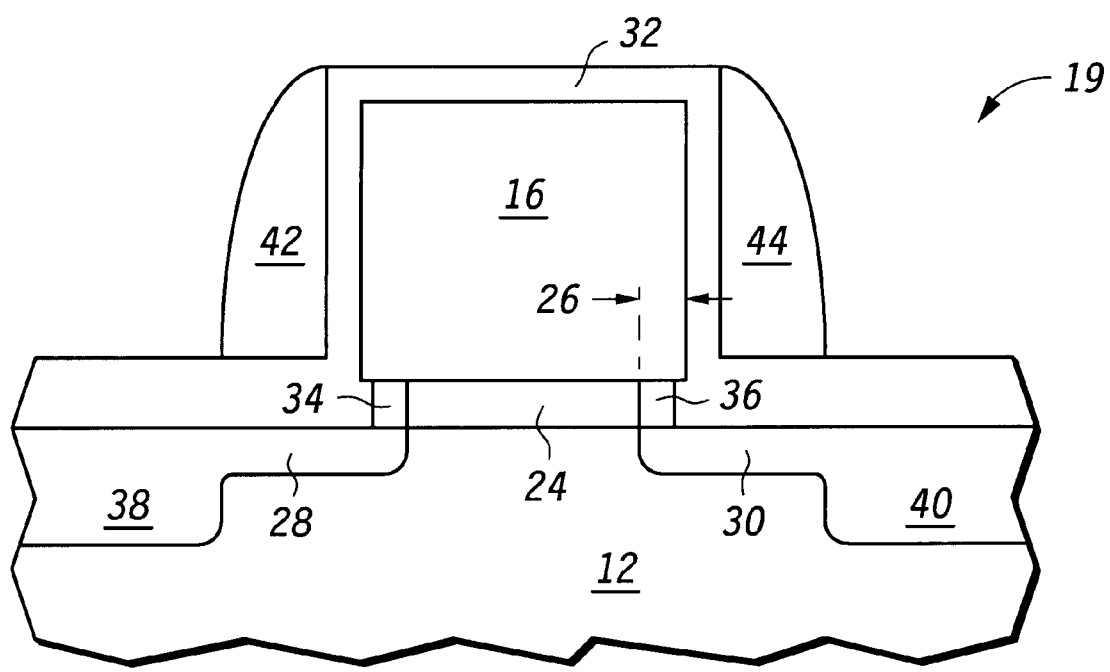

FIG. 7 illustrates device 19 after multiple heating processes typical of integrated circuit manufacturing that result in the diffusion of regions 28, 30, 38, and 40. These normal heating processes include, but are not limited to, such things as metal depositions, interlayer dielectric depositions, etch steps, and photoresist depositions and removals. These subsequent steps result in a very predictable and repetitive amount of lateral diffusion of these source/drain regions. Thus, for a given process the amount of lateral diffusion of regions 28 and 30 toward each other and thus toward the edges of high K dielectric 24 is highly predictable. This dimension should be very close to the same as width 26. Again, width 26 is the distance from the gate electrode 16 to the edge of the high K dielectric 24. Note that in the illustrated embodiment, gate electrode 16 has a length of between 10 nanometers to 200 nanometers. Although the source/drain regions should substantially line up with an edge of high K dielectric 24, there should be at least a slight overlap between regions 28 and 30 and high K dielectric 24. Thus, the amount of the under etch, or undercut, of high K dielectric 14 (see FIG. 1) to form resulting high K dielectric 24, which acts as the gate dielectric of device 19, is controlled keeping in mind the amount of diffusion that regions 28 and 30 will experience over processing.

The resulting device 19 shown in FIG. 7 has the benefit of significantly reduced Miller capacitance between gate electrode 16 and source/drain extension regions 28 and 30. The reduce Miller capacitance is a result of forming voids 34 and 36. Significant improvement can also be obtained if voids 34 and 36 are filled with a relatively low K material, a material lower in K than the dielectric constant of high K material 24. Voids 34 and 36 may be achieved with minimal additional processing complexity. It does require that the removal of the high K dielectric be timed and controlled very accurately, but the removal of the high K dielectric must be done anyway to contact the source/drain region, so there is minimal additional processing to achieve the benefit of a lower Miller capacitance. If natural diffusion does not provide the desired dimensions of the source/drain regions extensions 28 and 30, the channel length can be reduced further by an angled implant as provided above in the discussion of FIG. 4. The result would be that extensions 28 and 30 would be closer together and thus result in a reduced channel length. The etching of high K dielectric 14 would then be adjusted accordingly to match the resulting location of the source/drain extensions.

Although the present invention has been described with reference to a specific embodiment, further modifications and improvements will occur to those skilled in the art. Therefore, it is intended that this invention encompass all such variations and modifications as fall within the scope of the appended claims.

What is claimed is:

1. A method for forming a semiconductor device, comprising the steps of:

providing a substrate having a surface;

forming a high-K dielectric layer on the surface of the substrate;

forming a gate electrode on the high-K dielectric layer having a gate electrode length of between 10 nanometers to 200 nanometers;

etching the high-K dielectric layer until a lateral edge of the high-K dielectric layer is undercut about 10 angstroms to 500 angstroms from an edge of the gate electrode to form a high-K dielectric between the gate electrode and the substrate;

annealing the high-K dielectric layer in an HCl ambient to further etch the high-K dielectric from the edge of the gate electrode to an edge of the high-K dielectric, an edge of the gate electrode extending beyond an edge of the high-K dielectric and to form a space between the gate electrode and the substrate at the edge of the high-K dielectric;

forming source region and a drain region in the substrate adjacent to the gate electrode, wherein an edge of one of the source region or drain region substantially aligns with an edge of the gate dielectric; and forming an insulator layer on the substrate adjacent to the gate electrode and at least on one side of the gate electrode, the insulator layer extending only partially into the space between tie gate electrode and the substrate to form a void.

2. The method of claim 1, wherein the step of forming a high-K dielectric layer comprises forming the high-K dielectric layer from one of a group consisting of: Hafnium oxide, Hafnium aluminate, Lanthanum aluminate, zirconium aluminate, Hafnium silicate, Zirconium silicate, aluminum oxide, or combination thereof.

3. The method of claim 2, wherein the step of removing a portion of the high-K dielectric layer further comprises the step of:

annealing the semiconductor device at a temperature of between 500 and 800 degrees Celsisus in halide-containing chemistry for between 10 and 100 seconds.

4. The method of claim 3, wherein the halide-containing chemistry comprises HCl or $Cl_2$.

5. The method of claim 1, further comprising the step of forming an extension of the source/drain regions.

6. The method of claim 5, further comprising the step of annealing the semiconductor device to extend the source/drain regions to substantially align with the edge of the gate dielectric.

7. The method of claim 6, further comprising the step of forming a sidewall spacer on the insulator layer adjacent to the electrode.

8. A method for forming a semiconductor device, comprising the steps of:

providing a substrate having a surface;

forming a high-K dielectric layer over the surface of the substrate having a dielectric constant greater than 3.9;

forming a gate electrode on the high-K dielectric layer having a gate length of between 10 nanometers to 200 nanometers;

etching the high-K dielectric layer until a lateral edge of the high-K dielectric layer is undercut about 10 angstroms to 500 angstroms from an edge of the gate electrode to form a high-K dielectric between the gate electrode and the substrate;

annealing the high-K dielectric layer in an HCl ambient to further etch the high-K dielectric from the edge of the gate electrode to an edge of the high-K dielectric, an edge of the gate electrode extending beyond an edge of the high-K dielectric and to form a space between the gate electrode and the substrate at the edge of the high-K dielectric;

forming source/drain regions in the substrate adjacent to the gate electrode, wherein an edge of the source/drain regions substantially align with an edge of the high-K dielectric; and forming an insulator layer on the substrate adjacent to the gate electrode and at least on one side of the gate electrode, the insulator layer extending only part of the predetermined distance between the gate electrode and the substrate to form a void.

9. The method of claim 8, wherein the step forming a high-K dielectric layer further comprises the steps of:

forming an interfacial layer on the substrate; and forming the high-K dielectric layer on the interfacial layer.

10. The method of claim 8, wherein the step of annealing the high-K dielectric layer further comprises the step of:

annealing the semiconductor device at a temperature of between 500 and 800 degrees Celsius in halide-containing chemistry for between 10 and 500 seconds.

11. The method of claim 8, wherein the step of forming source/drain regions further comprises the step of annealing the semiconductor device to extend the source/drain regions to substantially align with the edge of the gate dielectric.

* * * * *